(12) United States Patent
Chung (10) Patent No.: US 9,490,181 B2
(45) Date of Patent: Nov. 8, 2016

(54) MISALIGNMENT/ALIGNMENT COMPENSATION METHOD, SEMICONDUCTOR LITHOGRAPHY SYSTEM, AND METHOD OF SEMICONDUCTOR PATTERNING

(71) Applicant: Tian-Xing Huang, Tainan (TW)

(72) Inventor: Lien-Sheng Chung, Hsinchu County (TW)

(73) Assignee: Tian-Xing Huang, Tainan (TW)

( * ) Notice: Subject to any disclaimer, the term of this patent is extended or adjusted under 35 U.S.C. 154(b) by 0 days.

(21) Appl. No.: 14/546,645

(22) Filed: Nov. 18, 2014

(65) Prior Publication Data
US 2015/0140693 A1 May 21, 2015

(30) Foreign Application Priority Data

Nov. 19, 2013 (TW) .............................. 102142045 A
Jun. 27, 2014 (TW) .............................. 103122342 A (51) Int. Cl.
*H01L 21/66* (2006.01)
*H01L 21/033* (2006.01)
*G03F 9/00* (2006.01)
*G03F 7/20* (2006.01)

(52) U.S. Cl.
CPC ........... *H01L 22/12* (2013.01); *G03F 7/70633* (2013.01); *G03F 9/7076* (2013.01); *H01L 21/0338* (2013.01); *H01L 22/20* (2013.01)

(58) Field of Classification Search
CPC ............... H01L 22/12; H01L 45/1691; H01L 21/31144; H01L 22/20; H01L 23/544; H01L 21/0338; G03F 7/70633; G03F 7/70291; G03F 9/7076; G03F 7/70508; G03F 7/70616; G03F 9/7003; G03F 9/7084; G03F 7/70783
See application file for complete search history.

(56) References Cited

U.S. PATENT DOCUMENTS

| | | | | |
|---|---|---|---|---|
| 2006/0039597 | A1* | 2/2006 | Kotani | G03F 1/144 382/144 |
| 2007/0233305 | A1* | 10/2007 | Werkman | G03F 7/70633 700/121 |
| 2009/0269685 | A1* | 10/2009 | Yanagawa | G01B 11/002 430/30 |
| 2014/0065528 | A1* | 3/2014 | Kasa | G03F 9/70 430/30 |

* cited by examiner

*Primary Examiner* — Yasser A Abdelaziez
*Assistant Examiner* — Farun Lu
(74) *Attorney, Agent, or Firm* — Winston Hsu; Scott Margo (57) ABSTRACT

A misalignment/alignment compensation method for a lithography process includes the steps of: obtaining misalignment data associated with an alignment mark disposed on a substrate; and obtaining a compensation parameter by performing asymmetry compensation calculation on at least one of a first directional component of the misalignment data, which is associated with a first direction, and a second directional component of the misalignment data, which is associated with a second direction.

16 Claims, 9 Drawing Sheets

FIG.1

PRIOR ART

MISALIGNMENT/ALIGNMENT COMPENSATION METHOD, SEMICONDUCTOR LITHOGRAPHY SYSTEM, AND METHOD OF SEMICONDUCTOR PATTERNING

CROSS-REFERENCE TO RELATED APPLICATION

This application claims priority to Taiwanese Application Nos. 102142045 and 103122342, respectively filed on Nov. 19, 2013 and Jun. 27, 2014.

BACKGROUND OF THE INVENTION

1. Field of the Invention

The invention relates to a method for misalignment/alignment compensation, and more particularly to a misalignment/alignment compensation method, a system and a patterning method for a semiconductor process.

2. Description of the Related Art

A semiconductor process refers to a process used to create a large number of semiconductor devices on a wafer using a multiple-step sequence of photolithographic and chemical processing steps. In such a highly-laminating process, when one of laminated layers is misaligned, the subsequent layers may thus be affected and further misaligned, thereby leading to failure of electrical connections among semiconductor devices and the layers, function losses, or short circuits. Therefore, precise and stable overlay control is a relatively important factor for process management to ensure yield of the semiconductor devices and efficiency of production.

For example, a conventional step-and-repeat aligner (i.e., a stepper or scanner) usually has an alignment sensor for detecting alignment marks that are disposed at specific locations of a wafer before a lithography exposure process, and an alignment offset of the aligner may be calculated according to the detected misalignment/alignment. If a subsequent rework process is required for the wafer, the overlay offset may be used to calibrate the aligner for ensuring optimal alignment between patterns of a current patterning layer (or an upper layer) and a previous patterning layer (or a lower layer).

Figure 1:
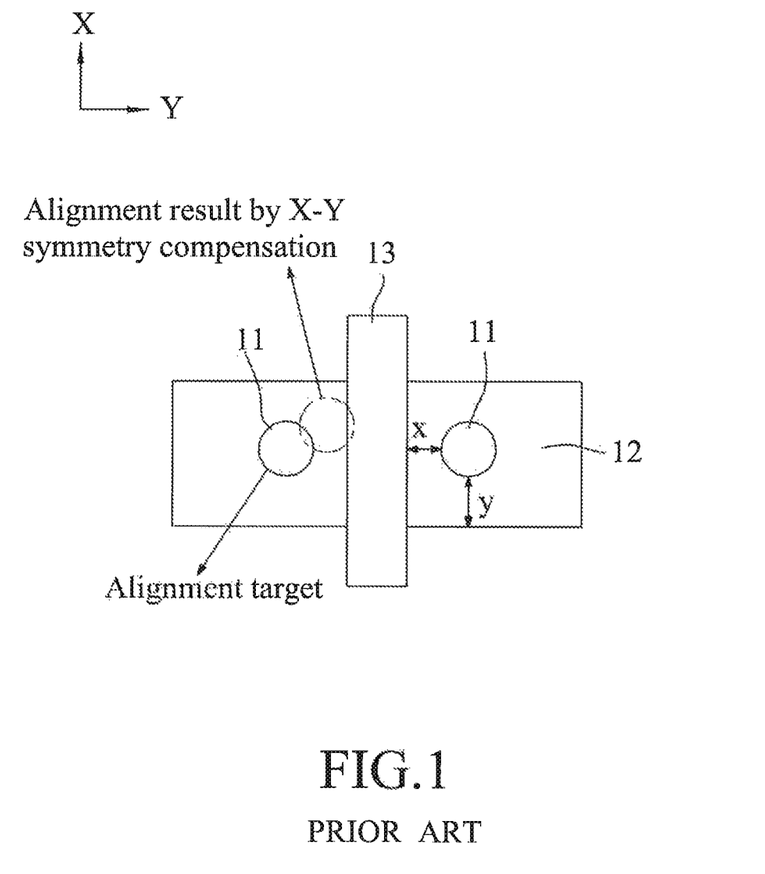
FIG. 1 is a top view illustrating a pattern with an asymmetry alignment margin/overlay requirement structure, and an alignment result using symmetry compensation.

Conventionally, the alignment or overlay offset is obtained by using the overlay misalignment data in symmetry or independent calculation in both X-direction and Y-direction, which is unable to satisfy asymmetry overlay compensation requirements between the X-direction and the Y-direction, especially in advanced process generation with single orientation layout for resolution consideration. Referring to FIG. 1 as an example, in a common process of fabricating metal-oxide-semiconductor (MOS) devices, a required overlay distance or alignment margin x between a contact hole 11, and an edge of a diffusion region 12, is different from a required distance or alignment margin y between the contact hole 11 and a poly gate 13. Since the overlay distance requirement or alignment margin x in the X-direction and the overlay distance requirement or alignment margin y in the Y-direction are different (in FIG. 1, x<y), a theoretical weight of an offset in the X-direction should be greater than that in the Y-direction. However, conventional calculations of the overlay offset uses symmetry or independent calculation for compensations in the X-direction and the Y-direction, which is not suitable for a structure that has asymmetric alignment requirements in the X-direction and the Y-direction, and which may result in non-optimization of alignment or non-optimization of the overlay offset after compensation. For example, a short circuit risk may occur between the contact hole 11 and the poly gate 13, as shown by an overlap of a dotted circle and the poly gate 13 in FIG. 1.

SUMMARY OF THE INVENTION

Therefore, an object of the present invention is to provide a misalignment/alignment compensation method that is suitable for an asymmetry alignment margin/overlay requirement structure, to thereby ensure patterns of a current patterning layer being optimally aligned with patterns of previous patterning layers, satisfy alignment requirements for devices, and/or promote-optimization of alignment.

According to one aspect of the present invention, a misalignment/alignment compensation method for a lithography process comprises:

obtaining misalignment data associated with an alignment mark disposed on a substrate; and obtaining a compensation parameter by performing asymmetry compensation calculation on at least one of a first directional component of the misalignment data, which is associated with a first direction, and a second directional component of the misalignment data, which is associated with a second direction.

Another object of the present invention is to provide a semiconductor lithography system that is adapted for implementing the misalignment/alignment compensation method of this invention, i.e. asymmetry compensation.

According to another aspect of the present invention, a semiconductor lithography system comprising:

an obtaining-and-storing unit configured to obtain and store misalignment data associated with at least two alignment marks disposed on the substrate;

a compensation parameter calculating unit configured to obtain a compensation parameter by performing asymmetry compensation calculation on at least one of a first directional component of the misalignment data, which is associated with a first direction, and a second directional component of the misalignment data, which is associated with a second direction; and a lithography unit configured to perform a lithography process on a substrate, and to perform alignment compensation according to the compensation parameter.

Yet another object of the present invention is to provide a method of semiconductor patterning.

According to yet another aspect of the present invention, a method of semiconductor patterning is to be implemented utilizing a lithographic tool, and comprises:

performing a lithographic alignment and patterning process on a wafer layer for forming a lithographic pattern; and determining position offset corrections based upon at least one asymmetry tolerance factor involved in the lithographic alignment and patterning process.

BRIEF DESCRIPTION OF THE DRAWINGS

Other features and advantages of the present invention will become apparent in the following detailed description of embodiments with reference to the accompanying drawings, of which.

DETAILED DESCRIPTION OF THE EMBODIMENTS

The compensation method for alignment control or overlay control of an aligner 3 (see FIG. 2) according to the present disclosure is adapted for a fabrication process of semiconductor devices, in which an alignment structure with asymmetry margin/tolerance exists among a current patterning layer and previous patterning layers (as shown in FIG. 1). The misalignment/alignment compensation method may ensure that a pattern of the current layer which has alignment marks thereon is optimally aligned with a pattern of the previous layers, thereby enhancing alignment optimization of the semiconductor devices.

Figure 2:
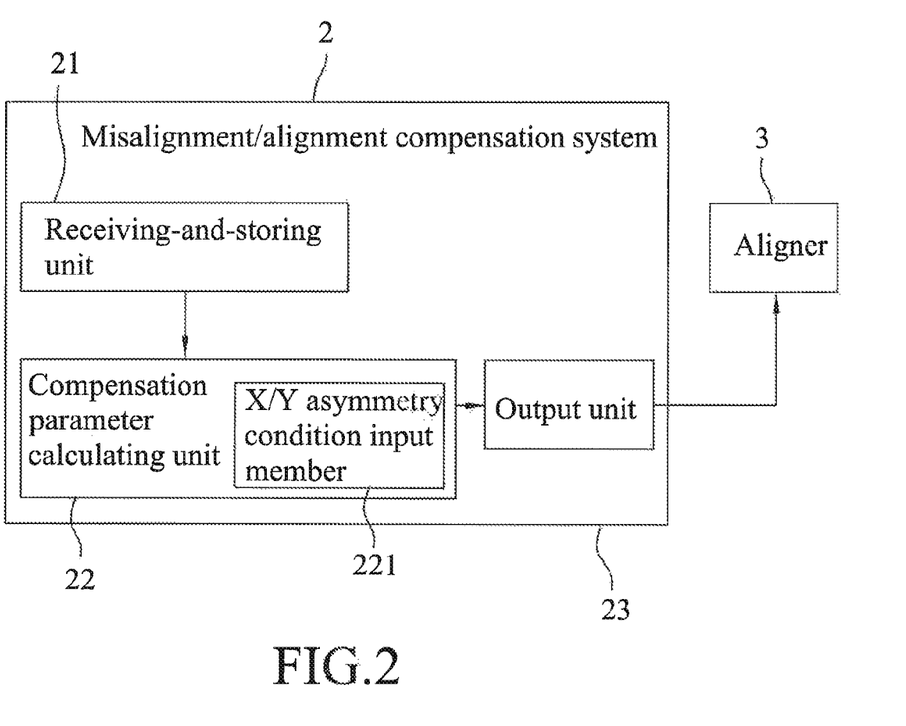
FIG. 2 is a block diagram illustrating a semiconductor lithography system to implement a misalignment/alignment compensation method according to the present disclosure.

Referring to FIG. 2, the misalignment/alignment compensation method of this disclosure is performed by a misalignment/alignment compensation system 2.

The misalignment/alignment compensation system 2 includes a receiving-and-storing unit 21, a compensation parameter calculating unit 22, and an output unit 23.

The receiving-and-storing unit 21 receives and stores plural sets of misalignment data from a semiconductor substrate via, for example, direct scanning measurement or calculation.

It should be noted that the misalignment data may be measurement or calculation results in polar coordinates (r, θ) or Cartesian coordinates (x, y). In this embodiment, the misalignment data are exemplified using the Cartesian coordinates, but the present invention should not be limited in this respect.

The receiving-and-storing unit 21 may be an ordinary addressing/positioning equipment, a misalignment measuring machine (e.g., a stepper, a scanner, etc.), or a storage device included in a misalignment measuring machine that is capable of receiving and storing raw misalignment data (x, y). The misalignment data may be obtained from misalignment between alignment marks on the current patterning layer and the previous patterning layers (e.g., the layers patterned before the current layer) of the semiconductor substrate, or from comparison between measured coordinates of the alignment marks and predetermined coordinates with respect to the substrate.

The compensation parameter calculating unit 22 includes a calculator configured to perform asymmetry overlay compensation calculation on multiple sets of the misalignment data that are stored in the receiving-and-storing unit 21, thereby obtaining a compensation parameter. The compensation parameter calculating unit 22 may further include an X/Y asymmetry condition input member 221 for a user to input asymmetry overlay alignment conditions (i.e., user-defined asymmetry conditions, which may be associated with a difference (e.g., different tolerances/margins or weightings) with respect to an X-direction and a Y-direction, so that the calculator may perform the asymmetry overlay compensation calculation accordingly and obtain the compensation parameter.

In one embodiment, each set of the misalignment data is represented using (x, y), where x is a value of the misalignment data in the X-direction (a first directional component), and y is a value of the misalignment data in the Y-direction (a second directional component). The compensation parameter calculating unit 22 may use the calculator to perform non-equal conversion on the first directional component x and/or the second directional component y, thereby obtaining a set of converted data (x', y') that corresponds to the set of the misalignment data (x, y). Then, the compensation parameter calculating unit 22 uses the converted data (x', y') to perform compensation parameter calculation, thus obtaining the compensation parameter.

In another embodiment, the asymmetry condition input member 221 may be used for input of the user-defined asymmetry conditions for the alignment marks with respect to the X-direction and the Y-direction, and the calculator may use the user-defined asymmetry conditions to directly perform the compensation parameter calculation, thus obtaining the compensation parameter. Note that the user-defined asymmetry conditions may be asymmetric tolerances/margins, asymmetric values specified in a device specification, or asymmetric weighted values that are asymmetric between the X-direction and the Y-direction. The user-defined asymmetry conditions may be inputted in a form of a number, a ratio or a percentage. For example, the user-defined asymmetry conditions may be inputted as: (0.2, 0.1), 0.5 (0.1/0.2) or 50%.

The compensation parameter calculating unit 22 may be a calculating system built in the aforementioned stepper, scanner, an independent computer system, or the misalignment measuring machine, which may further convert the misalignment data (x, y) into (x', y') to perform compensation parameter calculation, thus obtaining the compensation parameter. In addition, the compensation parameter calculating unit 22 may further use the compensation parameter to perform conversion and calculation on the misalignment data (x, y), thus obtaining misalignment residuals.

The output unit 23 may be a computer system built in the aforementioned stepper, scanner or the misalignment measuring machine, or an independent computer system, which is configured to output the compensation parameter to an aligner 3, thereby enabling the aligner 3 to perform asymmetry alignment compensation on the semiconductor substrate.

Figure 3:
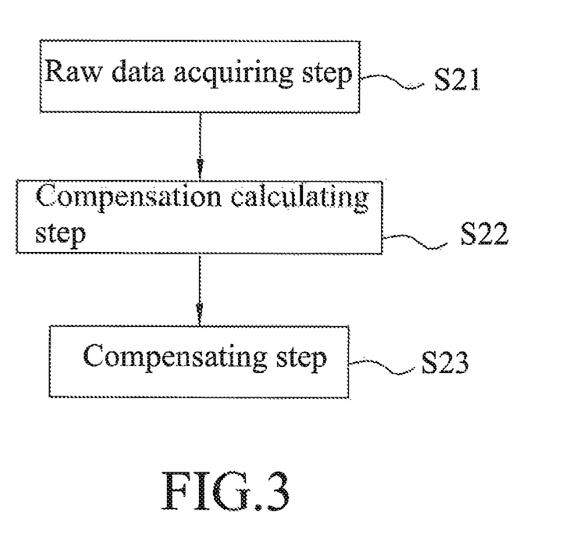
FIG. 3 is a flow chart illustrating steps of a first embodiment of the misalignment/alignment compensation method according to the present disclosure.

Referring to FIG. 3, the first embodiment of the misalignment/alignment compensation method according to this disclosure includes a raw data acquiring step S21, a compensation calculating step S22 and a compensating step S23.

In step S21, the receiving-and-storing unit 21 obtains plural sets of misalignment data (x, y) that are associated with misalignment among the current patterning layer and the previous patterning layers of the semiconductor substrate processed with a lithography process including photoresist coating, aligning, exposing and developing, where x, y are misalignment values in the X-direction and the Y-direction, respectively.

The semiconductor substrate may be a liquid crystal panel/display, a semiconductor wafer, etc., which may be applied to different uses. In this embodiment, the substrate is exemplified using a semiconductor wafer. The misalignment data (x, y) may be measurement results acquired by the misalignment measuring machine measuring alignment marks that originally exist on the wafer surface, and/or measuring overlay marks that are formed on a laminated layer of the semiconductor wafer surface via a post-process. The raw misalignment data (x, y) thus acquired may be stored in the receiving-and-storing unit 21 after being measured/received thereby.

It should be noted that the aforementioned process is not limited to fabrication of integrated circuits (IC), and may be applied to fabrication of other devices having a structure in micron-scale or nano-scale, such as an optical system, a pattern of a photoreticle, an inspection pattern of a magnetic storage device, a flat panel display, a liquid crystal display, etc. The substrate may be a base material that only has a previous patterning layer (or bottom layer) with the alignment marks, or may be a base material that already has multiple laminated layers.

In step S22, the compensation parameter calculating unit 22 performs non-equal conversion on the misalignment data (x, y), to thereby obtain the converted data (x', y'). Note that the non-equal conversion is non-equal between the X-direction and the Y-direction, and may be a conversion with respect to only one direction. Then, the compensation parameter calculation is performed using the converted data (x', y') to thereby obtain the compensation parameter.

Specifically, in step S22, the non-equal conversion is performed on plural sets of the misalignment data (x, y) to obtain plural sets of the converted data (x', y') that satisfy: x'=x−a, y'=y−B, where $A=\pm(S_x/2)$ or 0, $B=\pm(S_y/2)$ or 0, and $S_x$ and $S_y$ are respectively predetermined tolerance values in the X-direction and the Y-direction. The predetermined tolerance values may be spec values (i.e., values specified in a device specification) or acceptable tolerances/margins.

For details of step S22, the compensation parameter calculating unit 22 performs non-equal conversion on the misalignment data (x, y) by elementary arithmetic operations, linear functional operations, polynomial operations or combinations thereof, to thereby obtain the corresponding converted data (x', y').

In one example of step S22, the values x and y of the misalignment data (x, y) (i.e., the misalignment values respectively in the X-direction and the Y-direction) may be respectively and/or simultaneously multiplied by constants a and b (called a proportional relationship equation) for converting the misalignment data (x, y) into the converted data (x', y'), where x'=ax, y'=by, a≠b, a>0 and b>0. Preferably, a≠b, and one of the constants a and b is equal to 1. In another example, one of the values x and y of the misalignment data (x, y) may be added or subtracted by a constant m or n, or the values x and y of the misalignment data (x, y) may be respectively added or subtracted by the constants m and n (called a difference equation) for converting the misalignment data (x, y) into the converted data (x', y'), where x'=x±m, y'=y±n and m≠n. In addition, m≠0 and/or n≠0.

It should be noted that, since the aforementioned constants a, b, m and n are used to deform the misalignment data (x, y) for generating asymmetry results, values thereof are arbitrary in theory. However, in consideration of layouts and sizes of the devices, line widths and line spacing, the constants a and b are preferable to be greater than 0 and not greater than 2, and the constants m and n are preferable to be not greater than 10 nm.

The aforementioned built-in or independent compensation parameter calculating unit 22 performs the compensation parameter calculation using the converted data (x', y'), which is converted from the misalignment data (x, y), to thereby obtain the compensation parameter. The compensation parameter may be associated with wafer rotation, wafer translation, wafer expansion, reticle rotation and magnification, etc. Since the compensation parameter calculation, which conventionally uses the misalignment data (x, y) therein, is well-known to persons skilled in the art, details thereof are not described herein for the sake of brevity.

Finally, in step S23, the output unit 23 outputs the compensation parameter obtained in step S22 to the aligner 3 to serve as an alignment value/alignment compensation value with respect to the substrate having the raw misalignment data, so as to calibrate the aligner 3.

Figure 4:
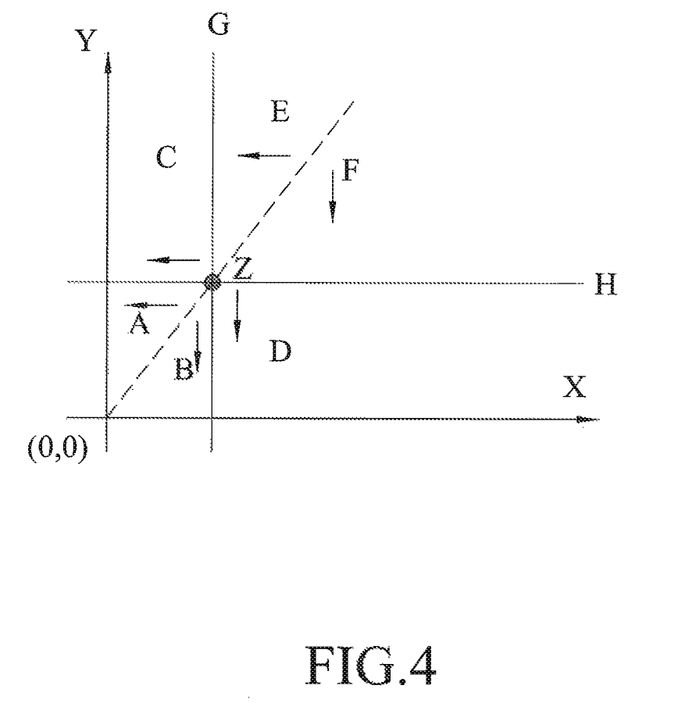
FIG. 4 is a plot illustrating results of non-equal conversion using a proportional relationship equation.

Specifically, FIG. 4 illustrates results of non-equal conversion on the raw misalignment data (x, y) using the proportional relationship equation, where x'=x×a and y'=y×b. Since the constant a is controlled to be not equal to the constant b, asymmetric deformation may be generated after conversion in step S22. As an example, a region A of FIG. 4 represents a conversion result in which the values x and y of the raw misalignment data Z are respectively multiplied by the constants a and b (where a<b<1). Therefore, misalignments in both of the X-direction and the Y-direction are processed to be better in the region A compared to the original raw misalignment data Z. However, a variation of the misalignment data in the X-direction is processed to be even better than that in the Y-direction. Note that "better" is defined to be a direction toward the origin (0, 0) herein, and "worse" is defined to be a direction away from the origin (0, 0) hereinafter. Therefore, when the converted data that falls in the region A is used in compensation parameter calculation, the compensation parameter thus obtained may have a greater compensation weight in the Y-direction compared to that in the X-direction. In another example, a region F of FIG. 4 represents a conversion result in which the values x and y of the raw misalignment data Z are respectively multiplied by the constants a and b (where a>b>1). Therefore, misalignments in both of the X-direction and the Y-direction are processed to be worse in the region F compared to the raw misalignment data Z. However, a variation of the misalignment data in the X-direction is processed to be even worse than that in the Y-direction. Therefore, when the converted data that falls in the region F is used in compensation parameter calculation, the compensation parameter thus obtained may have a greater compensation weight in the X-direction compared to that in the Y-direction.

Table 1 lists relationships among regions A to F, lines G and H, the constants a, b, the point Z (x, y), and comparisons between the variations of the converted data (x', y') and the raw misalignment data (x, y) in the X-direction and the Y-direction according to FIG. 4.

TABLE 1

| Region/ | | x', y' relative to x, y | | Relative variations of x', y' | |
|---|---|---|---|---|---|
| Line | Relationship | x' | y' | x' | y' |
| A | 1 > b > a | Better | Better | Better | Worse |
| B | 1 > a > b | Better | Better | Worse | Better |
| C | b > 1 > a | Better | Worse | Better | Worse |
| D | a > 1 > b | Worse | Better | Worse | Better |
| E | b > a > 1 | Worse | Worse | Better | Worse |
| F | a > b > 1 | Worse | Worse | Worse | Better |
| G | a = 1 | Constant | Worse/ | Constant | Worse/ |

TABLE 1-continued

| Region/ | | x', y' relative to x, y | | Relative variations of x', y' | |
|---|---|---|---|---|---|
| Line | Relationship | x' | y' | x' | y' |
| H | b = 1 | Worse/Better | Better Constant | Worse/Better | Better Constant |

Figure 5:
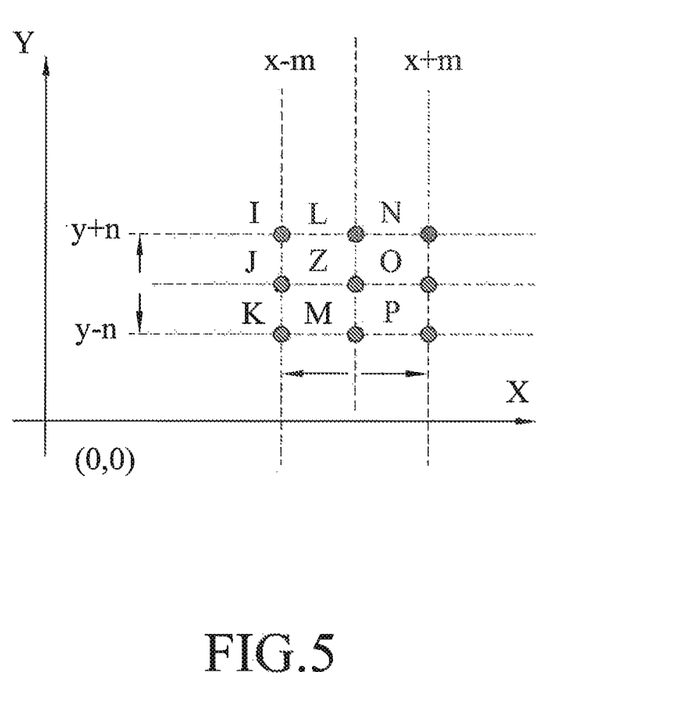
FIG. 5 is a plot illustrating results of non-equal conversion using a difference equation.

FIG. 5 illustrates results of non-equal conversion on the raw misalignment data (x, y) using the difference equation. As an example, converted data I (x', y') is a result of converting the raw misalignment data Z (x, y) by defining x'=x−m and y'=y+n, where m>0 and n>0. Therefore, misalignment of the converted I in the X-direction is processed to be better than that of the raw misalignment data Z in the X-direction. On the other hand, misalignment of the converted data I in the Y-direction is processed to be worse. Therefore, when the converted data I is used in compensation parameter calculation, the compensation parameter thus obtained may have a greater compensation weight in the Y-direction compared to that in the X-direction.

Table 2 lists comparison results between variations of the converted data I-P that are converted from the raw misalignment data Z using different constants m, n, and the raw misalignment data Z according to FIG. 5.

TABLE 2

| | x', y' relative to x, y | | Relative variations of x', y' | |
|---|---|---|---|---|
| Point | x' cp. x | y' cp. y | x' cp. y' | y' cp. x' |
| I | Better | Worse | Better | Worse |
| J | Better | Constant | Better | Constant |
| K | Better | Better | — | — |
| L | Constant | Worse | Constant | Worse |
| M | Constant | Better | Constant | Better |
| N | Worse | Worse | — | — |
| O | Worse | Constant | Worse | Constant |
| P | Worse | Better | Worse | Better |

In order to have similar tendencies during conversions of the misalignment data (x, y) into the converted data (x', y'), preferably, the conversion process is controlled to satisfy the same one of the following relationships: x/x'>y/y' and x/x'<y/y', and satisfy x×y'≠y×x', thereby causing all of the converted data (x', y') to have the same deformation tendency. Moreover, in order for the asymmetry misalignment compensation to have a relatively higher contribution in the calculation process of the compensation parameter, preferably, the compensation calculating step S22 is performed on at least half of the sets of the raw misalignment data (x, y).

It should be noted that, in the abovementioned first embodiment, both the directional components x, y are exemplified to be positive (i.e., the misalignment data (x, y) is located in a first quadrant). When the misalignment data (x, y) is located in another quadrant, the positive/negative signs of the values x, y may be considered in the calculation. In one example using the difference equation, x'=x+(x/|x|)×m and y'=y+(y/|y|)×n. In another example using the proportional relationship equation, x'=x×(x/|x|)×a and y'=y×(y/|y|)×b. Preferably, both of the constants a and b are greater than zero.

Furthermore, in order to ensure that the converted data (x', y') and the corresponding misalignment data (x, y) are located in the same quadrant, when x>0, x is to be shifted by m (m>0), such that x'=x+m; and when x<0, x' is configured to be x−m (m>0). Similarly, when y>0, y is to be shifted by n (n>0), such that y'=y+n; and when y<0, y' is configured to be y−n (n>0). In such a manner, a quadrant-change issue that may be encountered in step S22 and that results from the raw misalignment data (x, y) being close to the X-axis or the Y-axis may be avoided.

Figure 6:
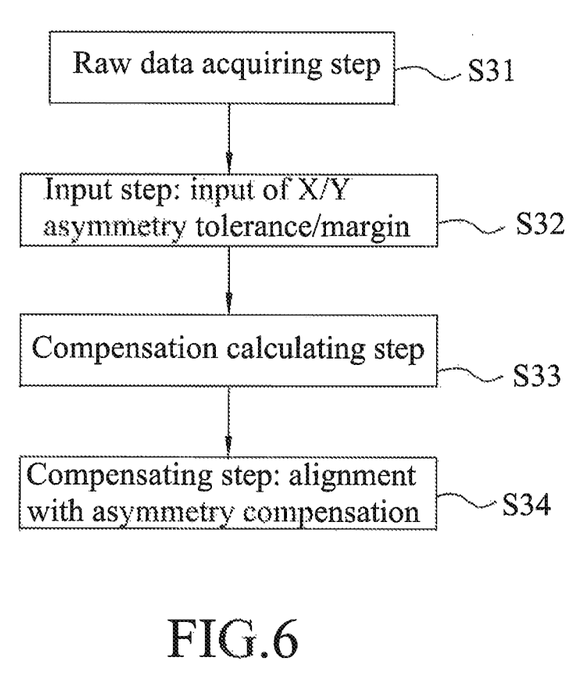
FIG. 6 is a flow chart illustrating steps of a second embodiment of the misalignment/alignment compensation method according to the present disclosure.

Referring to FIG. 6, the second embodiment of the misalignment/alignment compensation method according to this disclosure includes a raw data acquiring step S31, an input step S32, a compensation calculating step S33 and a compensating step S34.

In step S31, the receiving-and-storing unit 21 scans and stores plural sets of misalignment data (x, y) that are associated with misalignments among the alignment marks of the semiconductor substrate.

In step S32, the asymmetry overlay alignment conditions (i.e., the user-defined asymmetry conditions) that are asymmetric between the X-direction and the Y-direction is inputted via the asymmetry condition input member 221 of the compensation parameter calculating unit 22.

In step S33, the calculator of the compensation parameter calculating unit 22 performs the compensation parameter calculation on the misalignment data (x, y) using the asymmetry conditions inputted via the asymmetry condition input member, to thereby obtain the compensation parameter.

Note that the user-defined asymmetry conditions may be asymmetric tolerances/margins, asymmetric spec values specified in a device specification, or asymmetric weighted values of misalignments of the alignment marks in the X-direction and the Y-direction for a single exposure process, a single patterning process, a multi-exposure process, a multi-patterning process or a photoresist (PR) rework process. The asymmetry condition may be a ratio or a weighting of spec tolerances of the raw misalignment data in the X-direction and the Y-direction (e.g., X/Y=60/40), tolerances of the raw misalignment data in the X-direction and the Y-direction (e.g., |(X)|≤a or |(Y)|≤b), or a spec deviation value for the raw misalignment data between the X-direction and the Y-direction (e.g., |(X)|−|(Y)|=k).

In one application, the asymmetry conditions may be inputted each time the calculation of the compensation parameter is to be performed. In another application, the asymmetry conditions may be inputted only once, and the calculator may directly acquire the asymmetry conditions set for the previous process to perform compensation parameter calculation without inputting the asymmetry conditions anew.

Finally, in step S34, the compensation parameter thus calculated is inputted into the aligner 3, to thereby use the compensation parameter for calibration and compensation of the alignment/rework equipment.

Figure 7:
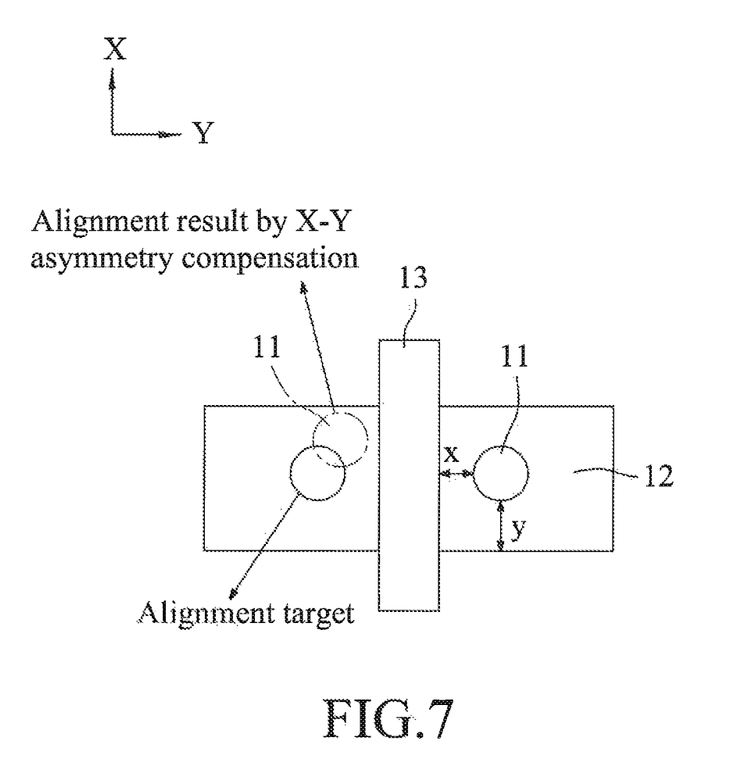
FIG. 7 is a top view illustrating the pattern with an asymmetry alignment margin/overlay requirement structure, and an alignment result using asymmetry compensation.

Referring to FIG. 7, when the X-Y asymmetry compensation as described in the first and second embodiment is applied to the example as illustrated in the prior section, a greater compensation weight may be acquired in the X-direction, a larger overlay margin may obtained between the contact hole 11 and the poly gate 13, and the short-circuit risk may be prevented.

The third embodiment disclosed herein uses the misalignment/alignment compensation method of this disclosure to serve as a misalignment/alignment control method of a lithography process.

Figure 8:
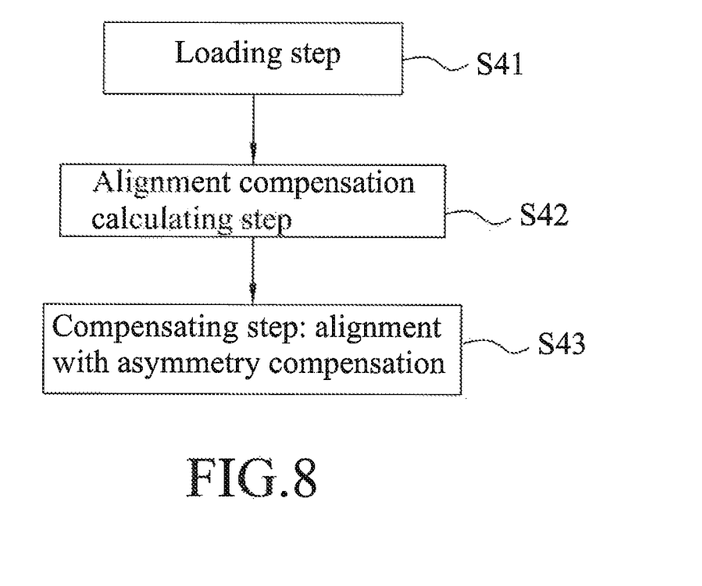
FIG. 8 is a flow chart illustrating steps of a third embodiment of the misalignment/alignment compensation method according to the present disclosure.

Referring to FIG. 8, the third embodiment of this disclosure is a method for semiconductor patterning, and includes a loading step S41, an alignment compensation calculating step S42, and a compensating step S43.

In step S41, a semiconductor substrate that contains at least two alignment marks on a surface thereof is coated with a photosensitive material layer, and is loaded on a lithography exposure unit. In this embodiment, the lithography exposure unit is an exposure (processing) equipment that performs alignment operation on the semiconductor substrate.

In step S42, the asymmetry overlay compensation calculation that is asymmetric between the X-direction and the Y-direction is performed on the misalignment data of the alignment marks, to thereby obtain the compensation parameter.

In one implementation, the asymmetry overlay compensation calculation may be performed by the compensation parameter calculating unit 22 performing non-equal conversion that is non-equal between the first directional component (i.e., in the X-direction) and the second directional component (i.e., in the Y-direction) of the misalignment data, and then obtain the compensation parameter. In another implementation, the compensation parameter calculating unit 22 may directly perform the compensation parameter calculation on the misalignment data using the user-defined asymmetry conditions of the X-direction and the Y-direction, to thereby obtain the compensation parameter. Details thereof are the same as those described in the first and second embodiments, and are thus omitted herein for the sake of brevity.

In step S43, the compensation parameter is inputted into the exposure (processing) equipment, and is used for calibration and compensation of alignment in an exposure and lithography process performed on the semiconductor substrate by the exposure equipment.

Figure 9:
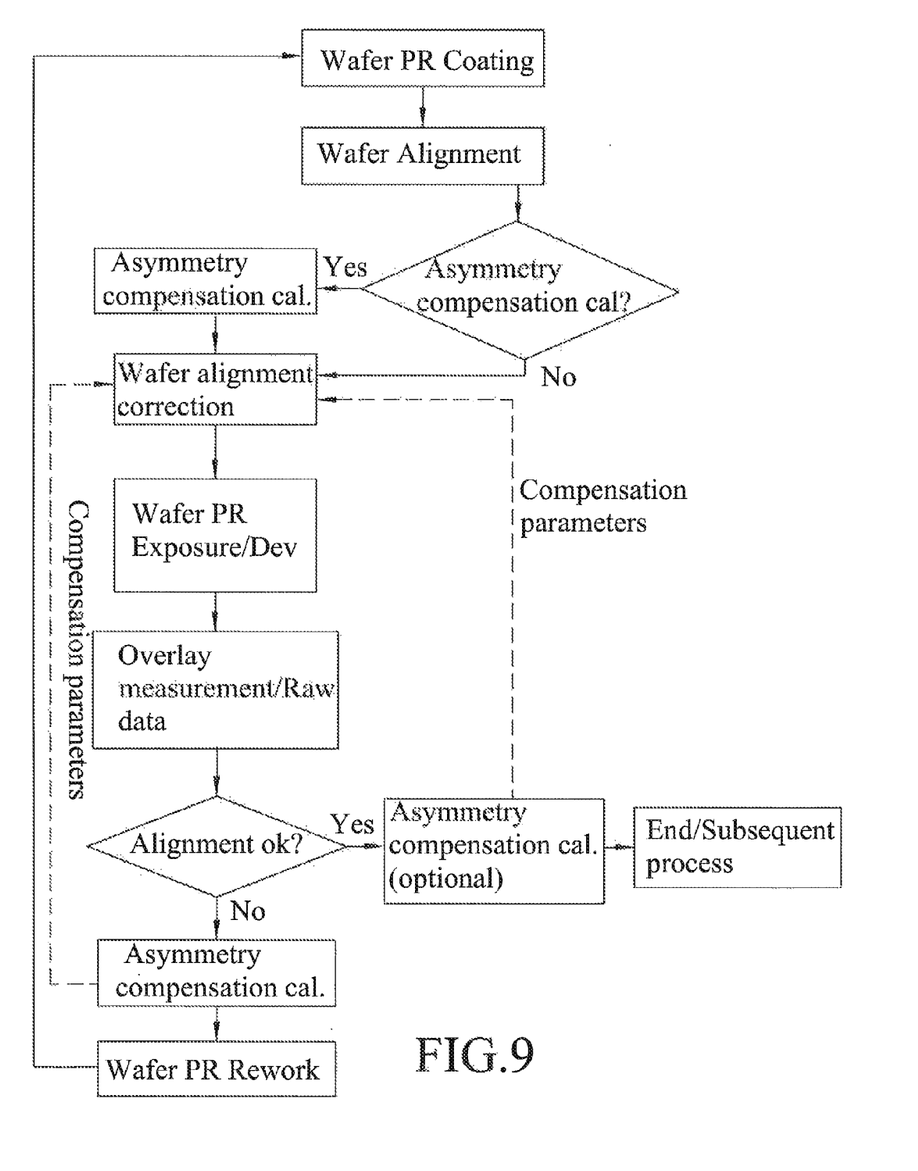
FIG. 9 is a flow chart illustrating steps of the third embodiment in another form.

In other words, referring to FIG. 9, in this embodiment, a lithographic tool (e.g., the lithography exposure processing unit) is utilized to perform a lithographic patterning process on a wafer layer (i.e., the semiconductor substrate), to thereby result in formation of a lithographic pattern on the wafer layer. After initial PR coating, the lithographic tool performs wafer alignment to obtain information of wafer deformation or wafer warpage. Then, based upon determination of asymmetry compensation calculation being required, the asymmetry compensation calculation may be performed according to the measured coordinates of the alignment marks and the predetermined coordinates. Then, wafer alignment correction is performed according to a result (i.e., the compensation parameters) of the aforesaid asymmetry compensation calculation, followed by wafer PR exposure/developing processes and overlay measurement, thus obtaining raw misalignment data. The alignment result is judged according to the raw misalignment data. When the alignment result is determined to be acceptable, asymmetry compensation calculation may be optionally performed to determine compensation parameters that are automatically provided back to an aligner of the lithographic tool and that may be applied to alignment correction of wafers that are to be processed later. Then, the wafer may be provided to a subsequent fabrication process (e.g., an etching process). When the alignment result is determined to be not acceptable, the asymmetry compensation calculation may be performed to determine the compensation parameters based upon asymmetry tolerance factors (e.g., the asymmetry overlay compensation calculation, the user-defined asymmetry conditions, etc.) involved in the lithographic alignment process. Then, feedback of the compensation parameters is automatically provided to the aligner of the lithographic tool, and the lithographic tool performs positional control (i.e., position offset correction/wafer alignment correction) of the lithographic tool according to the compensation parameters thus determined. After the asymmetry compensation calculation, PR rework is performed, and the flow goes back to PR coating for repeating the lithographic patterning process. Note that lithographic patterning process may be performed/repeated in order to form different lithographic patterns on different layers, and the asymmetry tolerance factors for each lithographic patterning process are independent from those of other lithographic patterning processes.

In summary, the present disclosure obtains the compensation parameter by using the user-defined asymmetry conditions between the X-direction and the Y-direction for the alignment marks to directly perform asymmetry overlay compensation parameter calculation on the misalignment data, or by first performing non-equal conversion between the X-direction and the Y-direction on the misalignment data that is stored in the receiving-and-storing unit, and then performing the compensation parameter calculation, to thereby satisfy alignment compensation requirement for asymmetry overlay optimization/requirement. In such a manner, the pattern of the current layer may be optimally aligned with the patterns of the previous patterning layers, thereby promoting optimization of alignment and satisfying requirements for the devices.

While the present invention has been described in connection with what are considered the most practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A misalignment/alignment compensation method for a lithography process, comprising:
   obtaining misalignment data associated with an alignment mark disposed on a substrate; and
   obtaining a compensation parameter by performing asymmetry compensation calculation on at least one of a first directional component of the misalignment data, which is associated with a first direction, and a second directional component of the misalignment data, which is associated with a second direction, wherein the asymmetry compensation calculation is performed according to a user-defined asymmetry condition that is asymmetric between the first direction and the second direction, and the user-defined asymmetry condition is associated with a difference with respect to the first direction and the second direction and in a form of a number, a ratio, a weighting or a percentage.

2. The misalignment/alignment compensation method according to claim 1, further comprising the step of enabling an aligner to perform alignment compensation according to the compensation parameter.

3. The misalignment/alignment compensation method according to claim 1, wherein:
   the misalignment data is obtained as a set represented using (x, y), where x is a value of the first directional component, and y is a value of the second directional component; the step of obtaining the compensation parameter includes:
   converting the misalignment data (x, y) into a set of converted data (x', y') by: performing non-equal conversion that is non-equal between the first directional component and the second directional component to convert x into x' that represents a first converted value associated with the first direction, and y into y' that represents a second converted value associated with the second direction; and obtaining the compensation parameter according to the converted data (x', y'); and at least one of the following relationships is satisfied: x≠x' and y≠y'.

4. The misalignment/alignment compensation method according to claim 1, wherein:

the misalignment data is obtained according to misalignment between the alignment mark and a desired location of the substrate;

the alignment mark is disposed on a later patterning layer of the substrate;

the desired location is a location of an alignment mark disposed on a former patterning layer of the substrate; and the former layer is formed on the substrate before the later layer.

5. The misalignment/alignment compensation method according to claim 1, wherein:

the misalignment data is obtained according to misalignment between the alignment mark and a desired location of the substrate;

the alignment mark is disposed on the substrate;

the desired location is predetermined coordinates with respect to the substrate.

6. The misalignment/alignment compensation method according to claim 1, wherein the user-defined asymmetry condition is asymmetric tolerances/margins or weighted values.

7. The misalignment/alignment compensation method according to claim 1, wherein the user-defined asymmetry condition is associated with one of a single exposure process, a multi-exposure process, a single patterning process, a multi-patterning process and a photoresist rework process of a semiconductor process.

8. The misalignment/alignment compensation method according to claim 7, wherein the user-defined asymmetry condition is associated with a difference with respect to the first direction and the second direction and in a form of a number, a ratio, a weighting or a percentage.

9. A semiconductor lithography system comprising:

an obtaining-and-storing unit configured to obtain and store misalignment data associated with at least two alignment marks disposed on a substrate;

a compensation parameter calculating unit configured to obtain a compensation parameter by performing asymmetry compensation calculation on at least one of a first directional component of the misalignment data, which is associated with a first direction, and a second directional component of the misalignment data, which is associated with a second direction, wherein said compensation parameter calculating unit is configured to perform the asymmetry compensation calculation according to a user-defined asymmetry condition that is asymmetric between the first direction and the second direction, and the user-defined asymmetry condition is associated with a difference with respect to the first direction and the second direction and in a form of a number, a ratio, a weighting or a percentage; and a lithography unit configured to perform a lithography process on a substrate, and to perform alignment compensation according to the compensation parameter.

10. The semiconductor lithography system according to claim 9, wherein said compensation parameter calculating unit includes an asymmetry condition input member configured for input of the user-defined asymmetry condition.

11. The semiconductor lithography system according to claim 10, wherein the user-defined asymmetry condition is asymmetric between the first direction and the second direction, and is associated with asymmetric tolerances/margins or weighted values.

12. The semiconductor lithography system according to claim 9, wherein:

the misalignment data is obtained according to misalignment between the alignment mark and a desired location of the substrate;

the alignment mark is disposed on a later patterning layer of the substrate;

the desired location is a location of an alignment mark disposed on a former patterning layer of the substrate; and the former layer is formed on the substrate before the later layer.

13. The semiconductor lithography system according to claim 9, wherein:

the misalignment data is obtained according to misalignment between the alignment mark and a desired location of the substrate;

the alignment mark is disposed on the substrate;

the desired location is predetermined coordinates with respect to the substrate.

14. A method of semiconductor patterning, said method to be implemented utilizing a lithographic tool, and comprising:

performing a lithographic alignment and patterning process on a wafer layer for forming a lithographic pattern; and determining position offset corrections based upon at least one asymmetry tolerance factor involved in the lithographic alignment and patterning process, wherein said at least one asymmetry tolerance factor is user-defined, said at least one asymmetry tolerance factor is asymmetric between a first direction and a second direction, and said at least one asymmetry tolerance factor is associated with a difference with respect to a first direction and a second direction and in a form of a number, a ratio, a weighting or a percentage.

15. The method according to claim 14, further comprising repeating the performing step and, the determining step, wherein said at least one asymmetry tolerance factor for each of the lithographic alignment and patterning process is independent from that for other lithographic alignment and patterning process(es).

16. The method according to claim 14, further comprising the step of: performing positional control of the lithographic tool according to the position offset corrections thus determined.

* * * * *